United States Patent
Brooks (10) Patent No.: US 9,552,877 B2
(45) Date of Patent: Jan. 24, 2017

(54) WRITABLE DEVICE BASED ON ALTERNATING CURRENT

(71) Applicant: HEWLETT-PACKARD DEVELOPMENT COMPANY, L.P., Houston, TX (US)

(72) Inventor: Robert J. Brooks, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/889,738

(22) PCT Filed: May 29, 2013

(86) PCT No.: PCT/US2013/043191
§ 371 (c)(1),
(2) Date: Nov. 6, 2015

(87) PCT Pub. No.: WO2014/193371
PCT Pub. Date: Dec. 4, 2014

(65) Prior Publication Data
US 2016/0104531 A1    Apr. 14, 2016

(51) Int. Cl.
*G11C 11/00* (2006.01)
*G11C 13/00* (2006.01)

(52) U.S. Cl.
CPC ....... *G11C 13/0069* (2013.01); *G11C 13/0002* (2013.01); *G11C 13/0007* (2013.01); *G11C 13/0009* (2013.01); *G11C 2013/008* (2013.01)

(58) Field of Classification Search
CPC ............. G11C 13/0002; G11C 13/0007; G11C 13/0069; G11C 13/0009; G11C 2013/008; G11C 11/16; G11C 13/0004; G11C 13/0011; G11C 13/003; G11C 13/004; G11C 13/0061; G11C 16/06; G11C 2013/0066
USPC ................................ 365/211, 148, 212, 242
See application file for complete search history.

(56) References Cited

U.S. PATENT DOCUMENTS

| | | | |
|---|---|---|---|
| 7,692,959 B2 | 4/2010 | Krusin-Elbaum et al. | |
| 7,724,562 B2 | 5/2010 | Meyer et al. | |
| 8,264,868 B2 | 9/2012 | Ribeiro et al. | |
| 2003/0103402 A1* | 6/2003 | Tran | G11C 11/16 365/211 |
| 2011/0261608 A1 | 10/2011 | Borghetti et al. | |
| 2012/0091421 A1 | 4/2012 | Wen et al. | |
| 2012/0132880 A1 | 5/2012 | Bratkowski et al. | |
| 2012/0218808 A1 | 8/2012 | Yasuda et al. | |

(Continued)

FOREIGN PATENT DOCUMENTS

KR    10-2012-0068347 A    6/2012

OTHER PUBLICATIONS

International Searching Authority, The International Search Report and the Written Opinion for PCT/US2013/043191 dated Feb. 27, 2014 (10 pages).

(Continued)

*Primary Examiner* — Thong Q Le
(74) *Attorney, Agent, or Firm* — Hewlett Packard Enterprise Patent Department (57) ABSTRACT

A nonvolatile memory device is writable to a high resistance state and a low resistance state. The nonvolatile memory device may be heated to at least a threshold temperature, based on application of an alternating current (AC) signal, and may be written based on application of a voltage bias.

15 Claims, 4 Drawing Sheets

(56) References Cited

U.S. PATENT DOCUMENTS

2013/0054886 A1   2/2013   Eshraghian et al.

OTHER PUBLICATIONS

R. Berdan et al., "High Precision Analogue Memristor State Tuning," Electronics Letters, Aug. 30, 2012, vol. 48, No. 18, Available at: <ieeexplore.ieee.org/stamp/stamp.jsp?arnumber=6294542> (2 pages).

* cited by examiner

WRITABLE DEVICE BASED ON ALTERNATING CURRENT

BACKGROUND

Memristors may be written to different states using application of an electric current. Writing to memristors may involve a time-consuming process, including iteratively applying a small current and then checking the memristor device, to avoid overwriting. Issues associated with the writing process may further be exacerbated by formation of conductive filaments in the memristor device, resulting in high variation of characteristics between memristor devices, poor device endurance, and poor resistance control.

DETAILED DESCRIPTION

A memory device, such as a memristor, may change state due to being written. In an example, an applied signal may be used to heat a memristor device (liberating some of its ions from their potential wells) and/or provide an electric field across the memristor device. The liberated ions may drift toward one electrode or the other, depending on electric field polarity, to write the memory device to one state or another. Use of an applied current (e.g., for heating and providing an electric field) may cause the memristor to develop a region in its depleted-undepleted interface where a depleted zone can protrude into an undepleted zone. Such protrusions may result in concentrated regions of electrical current that experience relatively more heating compared to surrounding regions, liberating relatively more ions in the protrusions and lengthening those depleted zone protrusions. This may lead to undesirable formation of filamentary conduction (i.e., conductive filaments). Such conductive filaments may form and burn out several times during a write operation, which may cause damage and limit the endurance of memristor devices.

Examples provided herein may write to a nonvolatile memory device based on various thermal excitation and/or electric field induced drift mechanisms, including a controller using separate signals for thermal excitation and ion drift. For example, thermal excitation may be controlled according to an alternating current (AC) signal, and ion drift may be controlled according to a bias signal such as direct current (DC). Such signals may have independent (including non-overlapping) amplitude envelopes, which may reduce a tendency of the memory device to form conductive filaments. For example, the state of a memristor may be changed by applying an AC signal to generate a thermal gradient above a critical ion mobility level, and applying a DC signal lower than the AC signal to induce ion drift. The DC signal may be low enough to not increase the thermal gradient. Accordingly, systems may be provided that have greater reliability and endurance, less device-to-device variation leading to higher yield, and better power and speed characteristics.

Figure 1:
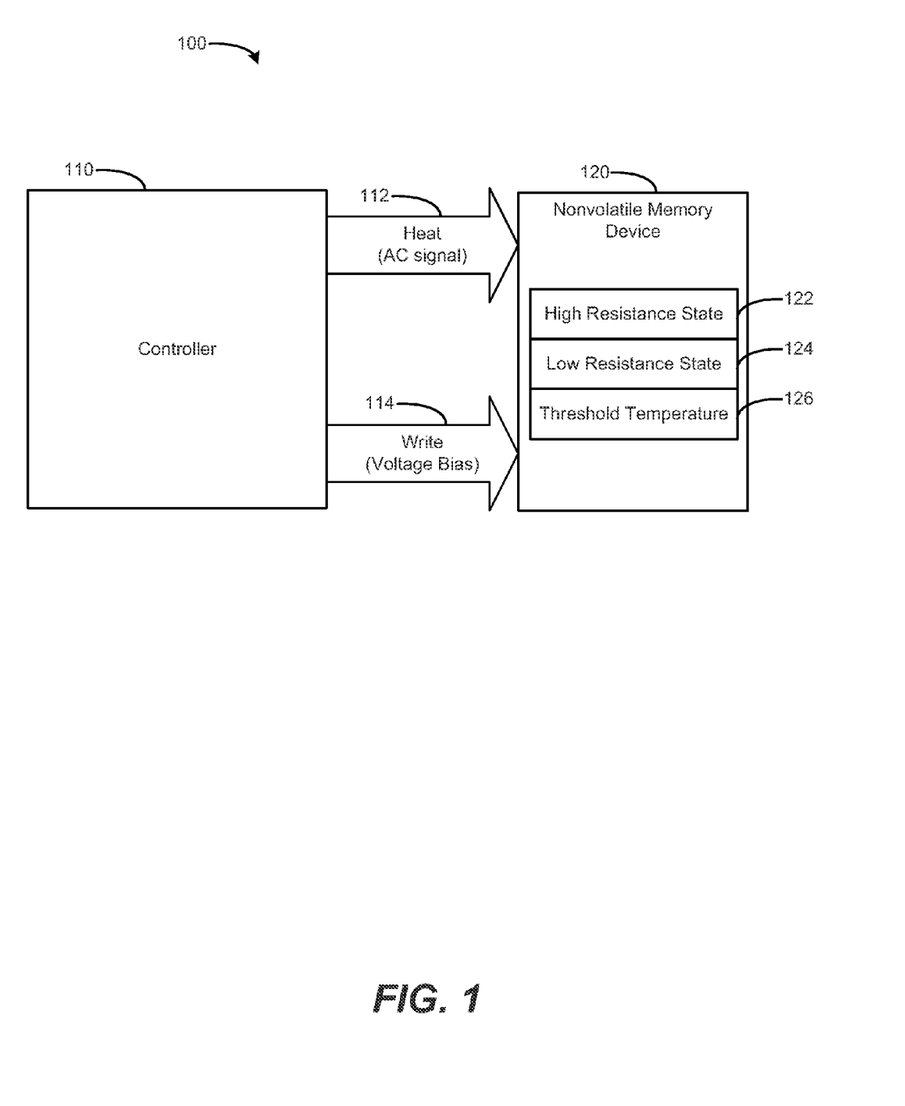
FIG. 1 is a block diagram of a system including a nonvolatile memory device according to an example.

FIG. 1 is a block diagram of a system 100 including a nonvolatile memory (NVM) device 120 according to an example. System 100 also includes controller 110, to provide a heat signal 112 and a write signal 114 to the NVM device 120. The NVM device 120 is associated with a high resistance state 122, a low resistance state 124, and a threshold temperature 126.

The NVM device 120 may be a memristor or other device including a metal oxide crystal that is not fully populated and is written based on ion drift/movement, and may include other forms of 2-terminal non-volatile memory devices that are based on resistance switching effects. The NVM device 120 may be heated up, e.g., by applying an AC signal 112, so that its ions have some degree of mobility. For example, the NVM device 120 may be heated to at least a threshold temperature 126 for ion mobility. Depending on a direction/polarity of voltage bias 114 (e.g., application of DC current), the ions may move one way or another to write the NVM device 120 to one state or another. For example, the NVM device 120 may be heated up without applying a voltage bias 114, such that the ions may diffuse to an equilibrium state, spread out evenly through the material of the NVM device 120, thereby achieving a low resistance state 124.

System 100 may separate a heating process from an electric-field-induced ion drift process, e.g., by using AC and DC signals to specifically control the processes. Use of a signal to specifically heat the NVM device 120 enables heating up the device using a safe signal that will not risk damaging the NVM device 120, in comparison to using a single signal to heat and write the device, which may lead to device overwrite and damage. Additionally, different types of signals may be used independently to achieve different device states, such as using a DC signal to write a high resistance state, and an AC signal to write a low resistance state.

Use of the AC signal 112 can protect the NVM device 120, e.g., when writing to a low resistance state. The AC signal 112 avoids a need to use DC to heat the NVM device 120 for every state transition. The DC signal may be used for heating to cause the ions to move. However, there is a risk that current from that DC signal heating may align with helping the ions to move, pushing the ions in the same direction that is induced by the heating current. Such use of a DC signal for heating may result in a type of run-away problem, because heating the device with a DC current also reinforces the ions in that same direction, which also lowers the device resistance, which increases current further, resulting in a run-away cycle. The AC signal 112 for heating NVM device 120 can avoid such a run-away condition associated with DC currents being aligned with ion drift.

Use of the AC signal 112 also may avoid the formation of conduction filaments in the NVM device 120. It is desirable for ions to move uniformly through the material of the NVM device 120, although ion movement may result in an irregularity in the ion distribution. Ion distribution can alter the electrical field based on the distribution, which may alter a typical path of least resistance for ions in that region. Movement of the ions in such a path may, in turn, tend to extend the extent of the low resistance area more and more, resulting in a progression of conduction filament growth according to undesirable positive feedback reinforcement. Such undesirable conduction filaments, and their unpredictable resistance behavior, may be avoided according to the examples provided herein, such as using an AC signal 112 for heating and a voltage bias signal 114 for writing the NVM device 120 to the high resistance state 122 or the low resistance state 124.

The low resistance state 124 may be achieved through diffusion, and may be achieved by heating up the NVM device 120 even without any particular write signal 114, i.e., without application of a net directional current or electric field/bias. In an example, the NVM device 120 may be heated with AC signal 112, to enable the diffusion process to happen naturally to achieve the low resistance state 124. However, such a technique may not push the ions forcefully, and they may be subjected to such heating and/or diffusion for a long duration (e.g., relative to a time needed to achieve a critical ion mobility) without damage (e.g., when the temperature is not heated excessively/unnecessarily high relative to that temperature associated with achieving critical ion mobility for enabling ion movement to write the memristor deive). A low resistance state is achievable by applying AC signal 112 with a sufficient amplitude for a sufficient time period (see, e.g., FIGS. 3A-3D) to achieve ion mobility.

Figure 3A:
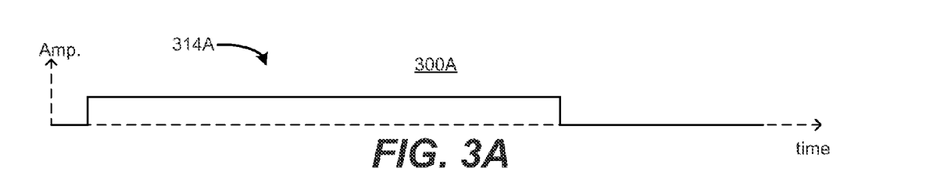
FIG. 3A is a chart of a signal according to an example.

The high resistance state 122 may be achieved by applying a DC signal (e.g., see FIG. 3A). Such a DC signal may provide an electric current for heating to liberate ions, and that electric current for high resistance state 122 will flow in a direction opposed to the diffusion process. The oppositional direction may result in piling up of ions at one terminal of the two-terminal NVM device 120, resulting in a self-limiting process (e.g., as resistance goes higher and higher, current goes down). The NVM device 120 can stabilize at a point where the ions are no longer moving, in a steady-state condition. Accordingly, examples may achieve a high resistance state 122 without a need for the AC signal 112, though AC signal 112 may be used to further enhance the switching performance of NVM device 120.

Controller 110 may selectively apply AC signal 112 and voltage bias signal 114 as needed for obtaining the different states 122, 124 of the NVM device 120. The controller 110 may apply the AC signal 112 and/or the voltage bias signal 114 selectively to achieve the various states, and may apply them to reduce a transition time between states.

Figure 2:
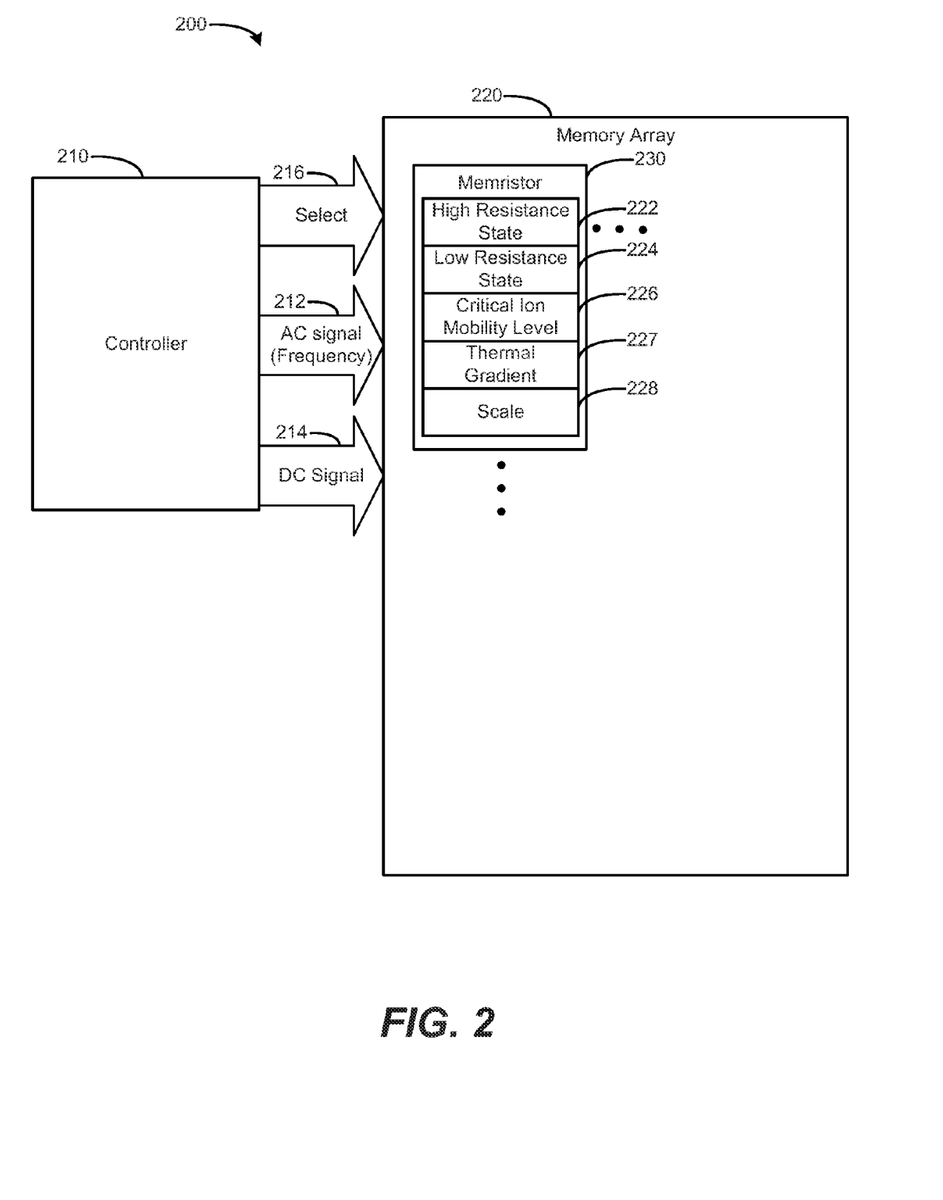
FIG. 2 is a block diagram of a system including a memory array according to an example.

FIG. 2 is a block diagram of a system 200 including a memory array 220 according to an example. System 200 also includes controller 210 to provide select signal 216, AC signal 212, and DC signal 214 to the memory array 220. The memory array 220 may include a plurality of memristors 230. A memristor may be associated with high resistance state 222, low resistance state 224, critical ion mobility level 226, thermal gradient 227, scale 228, and other characteristics.

The memory array 220 may be provided as a memory chip including a large array of NVM devices, such as memristors 230. The controller 210 may select, using the select signal 216, a given memristor 230 to be controlled. Selection may be based on a row and column selection, such as memristor crosspoint array, crossbar latches, and so on. When the memory array 220 is idle, the memristors 230 may be stable at a base level/state. In an example, the controller 210 may select a memristor 230 by applying a select (e.g., high) signal to one terminal of the memristor 230 to be selected, and low signal to the other terminal for that selected memristor 230. In an example, the controller 210 may provide the high signal and the low signal as opposites of each other, applied to each terminal of a selected memristor 230.

The controller 210 may vary a frequency of the AC signal 212 to be provided to the memory array 220. The AC signal 212 enables the memristor 230 to achieve temperatures compatible with the critical ion mobility level 226, in view of the thermal gradient 227 associated with temperatures of the memristor 230. The DC signal 214 may be used to achieve the high resistance state 222 and/or the low resistance state 224, e.g., while memristor temperature has reached at least the critical ion mobility level 226.

A memristor 230 may be fabricated at an associated device scale 228, such as 10 nm×10 nm in size or smaller per device, to provide a dense memory array 220 of many devices. Scale 228 of the memristor 230 may be reduced as fabrication technologies mature over time, e.g., to 3 nm scales and below.

FIGS. 3A-3D show charts of signals 300A-300D according to examples. The vertical axes represent signal amplitude (e.g., whether a signal is high/low/active/inactive). The horizontal axes represent time. The axes are chosen for illustrative convenience, and may or may not be shown to scale and/or, e.g., represent zero at the intersection of the axes. For example, instead of being scaled to represent zero, the origin of the chart may represent an arbitrary midpoint voltage, which may be zero or some other non-zero value. The midpoint voltage (represented by the horizontal axis) in an example may differ from an undriven voltage, e.g., the voltage on an unselected device. In an example, undriven rows and columns of a memristor memory array may remain near a midpoint voltage level, and may be driven to the midpoint voltage level immediately before they become undriven. Negative voltages are illustrated in terms of being shown passing below the midpoint. Thus, the term negative as used herein may refer to voltages less than zero (i.e., less than ground), and also may refer to voltages that are less than the midpoint voltage, including values that may not be less than zero/ground in an absolute sense.

The horizontal time axes illustrate signals over time that are associated with a non-instantaneous period of heat-up and cool-down. Such periods may be short, even sub-nanosecond, to enable heat levels to increase and/or decrease. There is no particular relationship between the different signals across FIGS. 3A-3D. For example, a length of time for one signal as applied may differ from another, although the signals have been illustrated for visual clarity and convenience (e.g., to visually align points in applied signals with points in the thermal gradient).

The various signals shown in FIGS. 3A-3D may represent a signal that is applied by a controller across two terminals of a memristor device. In an example, these signals are applied to one terminal of the memristor device, and the other terminal may be held at a midpoint voltage or other voltage such as ground. In alternate examples, the controller may apply a high signal to one terminal of the NVM device, and apply a low signal (e.g., an opposite of the high signal) to the other terminal of the NVM device.

Figure 3B:
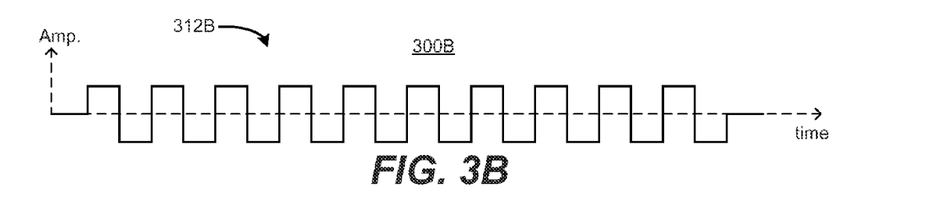
FIG. 3B is a chart of a signal according to an example.
Figure 3C:
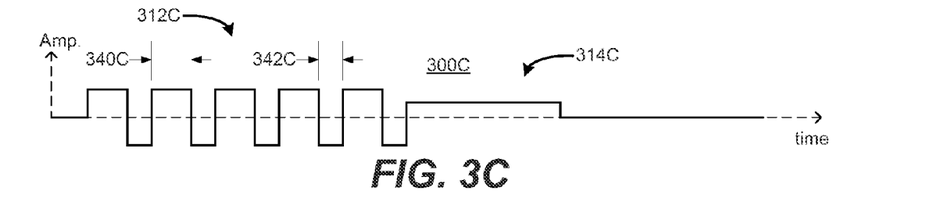
FIG. 3C is a chart of a signal according to an example.
Figure 3D:
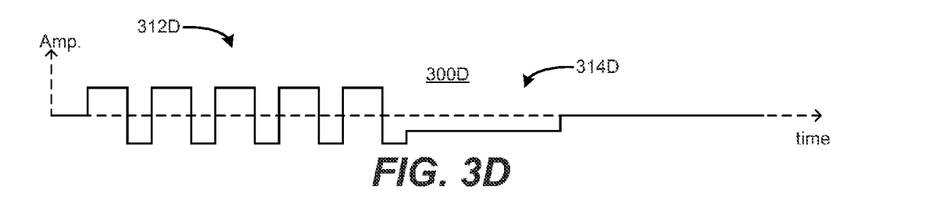
FIG. 3D is a chart of a signal according to an example.

The signals of FIGS. 3A-3D illustrate the use of various signaling techniques that may be applied by a controller, alone or in combination, to a NVM device. For example, FIGS. 3A and 3B illustrate pure DC and AC signal mechanisms. FIGS. 3C and 3D illustrate signal mechanisms including using an AC signal followed by a DC signal, using an AC signal having a DC bias, and using different amplitudes for an AC signal and a DC signal, for example.

FIG. 3A is a chart of a signal 300A according to an example. Signal 300A includes a DC signal 314A. A controller may apply signal 300A to a NVM device (e.g., across the two terminals of a memristor) to transition the NVM device to a high resistance state. The wave diagram of FIG. 3A illustrates that an AC signal is not present, and the DC signal 314A enables the transition to the high resistance state (although in alternate examples an AC signal may be used in conjunction with a DC signal for a transition to a high resistance state and/or low resistance state). The DC signal 314A is shown visually as a continuous signal. To achieve a transition to the high resistance state, a controller may apply signal 300A to a memristor, to present a corresponding current/electric field to the memristor, associated with the signal 300A going high. Such a signal may be applied in a direction that reinforces the spreading out of the ions in the memristor and achieving a low resistance state. The amplitude of the signal 300A may correspond to presenting the current to generate heat sufficient to meet or exceed a threshold temperature to sustain a critical ion mobility level. Thus, the DC signal 314A may be used to provide heat to an NVM device, and/or to provide ion movement to write the NVM device.

FIG. 3B is a chart of a signal 300B according to an example. The signal 300B includes an AC signal 312B, visually represented by a continuous signal. A controller may apply the AC signal 312B to transition an NVM device (e.g., memristor) to a low resistance state. Characteristics of the signal 300B, such as amplitude and frequency, enable the memristor to achieve a critical ion mobility level for state transition. The frequency of AC signal 312B may be chosen such that an amount of ion movement, during any one phase of the AC signal 312B, is small relative to a scale/size of the device. For example, if the NVM device is fabricated at a 10 nm thickness scale, then the controller may apply the AC signal 312B having a frequency and/or amplitude to move/vibrate the ions $\frac{1}{10}^{th}$ of the scale, or approximately 1 nm, in any given phase of the AC signal 312B. The AC amplitude and/or frequency may be chosen relative to a device scale/size such that as fabrication technology progresses and device scale is reduced, alternate examples may use correspondingly reduced phase AC signals.

It may be desirable to reduce ion movement that may be caused by the AC signal applied to the memristor. For example, the controller may choose amplitude and/or frequency characteristics of the AC signal 312B that are minimal while still capable of delivering sufficient energy to achieve critical ion mobility in the memristor within a desired timeframe. The controller may take into account other considerations, such as avoiding use of AC signal 312B of a sufficiently high amplitude/current and/or sufficiently low frequency such that the memristor material is heated to the point that its ions are liberated in a single phase of the AC signal 312B. Thus, asymmetrical ion movement may be avoided during the positive and negative phases of the AC signal 312B. Further benefits may be achieved by the controller using as high as possible of a frequency (e.g., depending on particulars of the controller circuitry), while providing just enough amplitude/current to accomplish the device heating over several phases to achieve a critical ion mobility level. For example, the controller may counteract negative effects of heating, by biasing the amplitude or width of the phases of the AC signal 312B (e.g., see the AC portions of the waveforms in FIGS. 3C and 3D).

FIG. 3C is a chart of a signal 300C according to an example. Signal 300C includes an AC signal 312C and a positive DC signal 314C. The AC signal 312C includes a positive phase width 340C and a negative phase width 342C. Signal 300C may be used to transition a memristor device to a high resistance state.

The example signal 300C utilizes both AC and DC phases to write a memristor device to a high resistance state, illustrating an alternative to the technique described above in FIG. 3A to write to the high resistance state based on a DC signal. The AC signal 312C is an asymmetric square wave, to illustrate a DC bias applied concurrently with AC, as shown by the difference between the positive phase width 340C and the negative phase width 342C. Further, an amplitude of the DC signal 314C is shown lower than that of the AC signal 312C. Thus, signal 300C illustrates a combination of multiple techniques for applying a signal to a memristor.

The signal 300C includes a phase to heat up an NVM device (memristor) based on AC signal 312C, and once a critical ion mobility is achieved, the controller may apply a relatively weaker DC signal 314C to accomplish the ion movement to write the device. Thus, heating being controlled and accomplished separately from the writing by ion movement, enables efficient and highly controllable techniques for controlling the memristor write.

The AC signal 312C may include a DC bias to provide additional control over a speed of writing a memristor. For example, the DC bias may be applied to the AC signal 312C as shown to enhance a write speed of the memristor. In an example, if a diffusion process associated with a memristor is slower than preferred, writes may be performed faster by applying a DC bias as shown to help the diffusion process to occur during application of the AC signal 312C for heating. The illustrated asymmetric AC pulse train (where the positive phase width 340C exceeds the negative phase width 342C) can accomplish this benefit during heating. In an alternate example, the asymmetry of the AC pulse train may be biased to oppose diffusion (e.g., where the negative phase width 342C would exceed the positive phase width 340C), to slow down the diffusion process during the heating phase caused by the AC signal 312C. For example, it may be desirable to control how fast diffusion occurs and thereby apply a slight DC bias to oppose any slight amount of diffusion expected during application of AC signal 312C (that may occur absent any DC bias). In an example, there may be some variation between different devices, as to how long of a heating period is desirable, so it may be preferable to minimize any net diffusion during the heating period, to encourage diffusion during the follow-on period of DC signal 314C after heating with AC signal 312C.

The example biased AC signal 312C of FIG. 3C (and FIG. 3D) illustrates a DC bias in the context of pulse-width modulation (PWM). However, other examples may achieve a DC biased AC signal 312C, 312D using amplitude modulation or other forms of modulation in addition to those specifically illustrated.

FIG. 3D is a chart of a signal 300D according to an example. Signal 300D includes an AC signal 312D and a negative (i.e., negative relative to the chart's midpoint voltage) DC signal 314D. The AC signal 312D includes a positive DC bias, based on having a positive phase width greater than a negative phase width. Signal 300D may be used to transition a memristor device to a low resistance state, based on utilizing AC/DC phases including the AC signal 312D and the DC signal 314D.

In FIG. 3D, as with FIG. 3C, the AC portion 312D is also positively biased, to affect ion movement during heating by the AC signal 312D. Similarly, the amplitude of the DC signal 314D has a lower absolute magnitude than the AC signal 312D. In alternate examples, varying levels of amplitude may be used, including amplitudes where the DC signal is equal or greater than the AC signal.

Figure 3E:
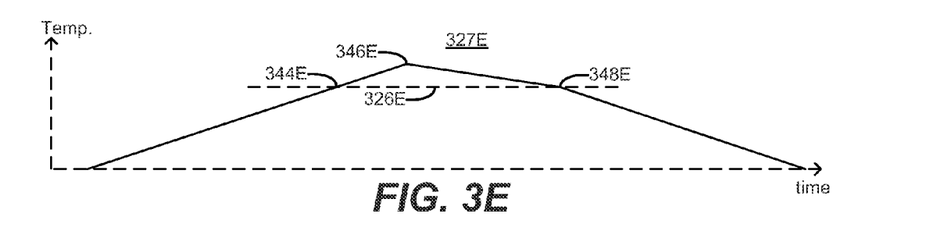
FIG. 3E is a chart of a thermal gradient according to an example.

FIG. 3E is a chart of a thermal gradient 327E according to an example. The thermal gradient 327E includes a first point 344E, a second point 346E, and a third point 348E, shown relative to a threshold temperature 326E associated with achieving a critical ion mobility level for writing a memristor device. The vertical axis in FIG. 3E corresponds to temperature, and the horizontal axis corresponds to time. The timescale of FIG. 3E may correspond to the horizontal axis of at least one of FIGS. 3A-3D.

For example, the first point 344E may correspond to a point at which heating by AC signals 312C, 312D enables sufficient ion mobility by achieving threshold temperature 326E. The second point 346E may correspond to a point at which heating by AC signal 312C, 312D ends, such that the thermal gradient no longer increases. After second point 346E, the thermal gradient decreases at a gradual slope, due to application of DC signals 314C, 314D having a lower relative amplitude than the AC signals 312C, 312D. From the first point 344E to the second point 346E and beyond, the thermal gradient is shown overshooting the threshold temperature 326E, to enable application of the DC signals while the thermal gradient is not increasing (e.g., decreasing as shown). Application of the DC signals does not cause the thermal gradient to increase, such that the thermal gradient eventually approaches the third point 348E. The third point 348E corresponds to reaching the threshold temperature 326E, at which point application of the DC signals 314C, 314D ends such that the slope decreases at a greater slope. The greater slope may correspond to a natural characteristic of a cooling memristor absent application of an AC or DC signal. The start/stop of various signals does not need to coincide with the various points of the thermal gradient 327E. For example, the DC signal may continue to be applied even though the thermal gradient has fallen below the threshold temperature 326E.

Thermal gradient 327E illustrates that heating based on the AC signal may be applied after surpassing the critical ion mobility level associated with the threshold temperature 326E. Although FIG. 3E illustrates the thermal gradient 327E rising above and falling below the threshold temperature 326E at first point 344E and third point 348E, alternate examples may adjust these points, e.g., based on adjusting a turn-on/turn-off of the AC and/or DC signals to before and/or after the points at which thermal gradient 327E rises above and/or falls below the threshold temperature 326E.

The thermal gradient 327E may include a first amplitude envelope, from the horizontal axis to the second point 346E at the peak of the thermal gradient curve. The thermal gradient 327E also may include a second amplitude envelope, from the second point 346E at the peak of the thermal gradient curve, to the origin. The illustrated thermal gradient 327E illustrates that a controller may heat up the memristor device during the AC portion of a signal, and the device may stay heated in the absence of the AC signal for long enough to enable the DC portion of the signal to cause sufficient ion drift to write to the device, before the thermal gradient 327E falls below the threshold temperature 326E. Thus, the DC portion of the signal does not need to be at an amplitude that would increase the thermal gradient (i.e., does not need to heat the memristor).

The gradual decrease of the thermal gradient 327E following the second point 346E is based on the amplitude of the DC signal 314C/314D being lower than that of the AC signal 312C/312D. The amplitude of the DC signal on its own may be low enough to not heat up the memristor device to a sufficient ion mobility point, because the illustrated example uses residual heat from application of the AC portion of the signal to provide the ion mobility. Thus, by using a DC signal that does not increase the thermal gradient (i.e., that does not continue to further heat the device), the illustrated example is not prone to excite a positive feedback loop of heating, ion movement, and current concentration, thereby avoiding conductive filament formation and enhancing device characteristics.

Figure 4:
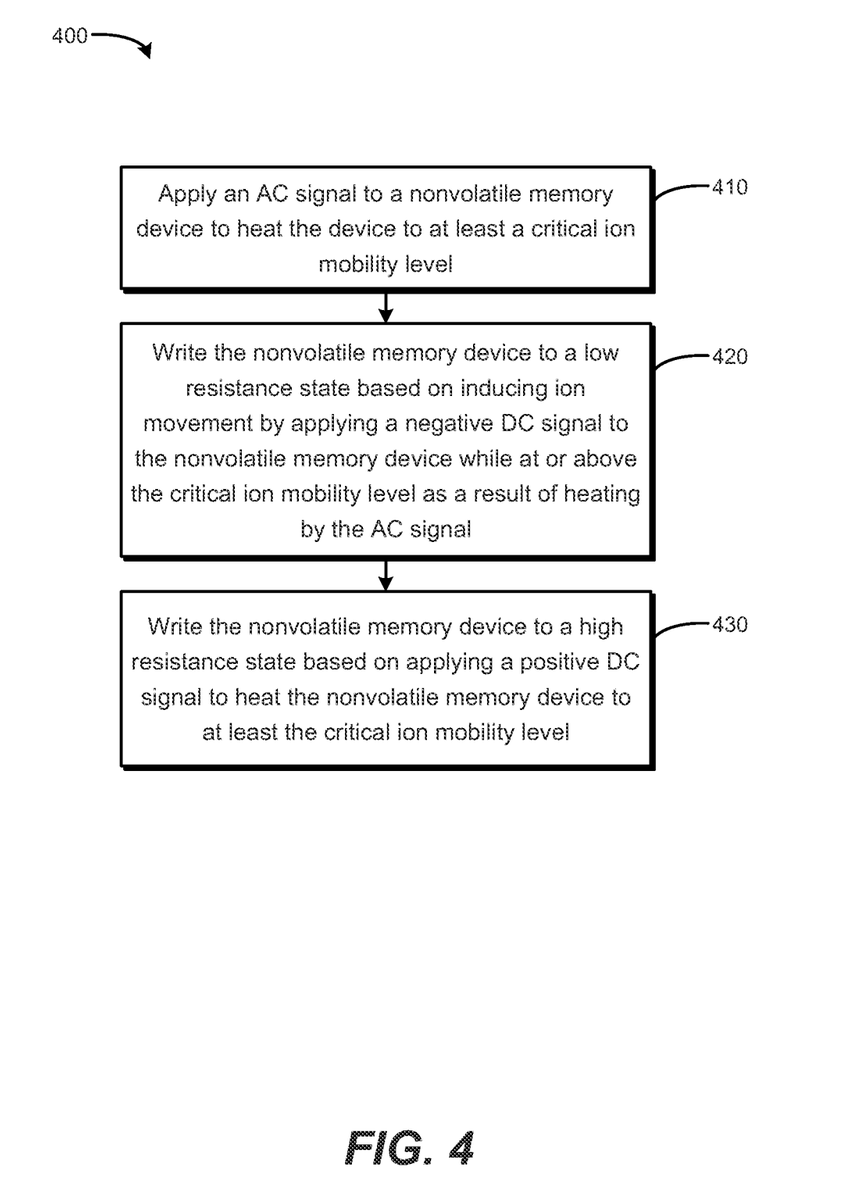
FIG. 4 is a flow chart based on writing a nonvolatile memory device according to an example.

Referring to FIG. 4, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated. For example, writing to a low resistance state may occur separately from and/or without writing to a high resistance state, and vice versa.

FIG. 4 is a flow chart based on writing a nonvolatile memory device according to an example. In block 410, an AC signal is applied to a nonvolatile memory device to heat the device to at least a critical ion mobility level. For example, a controller may apply an AC signal that includes a DC bias and has a high frequency, such that the device is heated to overshoot a threshold temperature corresponding to the critical ion mobility level. In block 420, the nonvolatile memory device is written to a low resistance state based on inducing ion movement by applying a negative DC signal to the nonvolatile memory device while at or above the critical ion mobility level as a result of heating by the AC signal. For example, the negative DC signal may be at a low enough amplitude to avoid heating the device (e.g., avoid increasing a thermal gradient associated with the device). In block 430, the nonvolatile memory device is written to a high resistance state based on applying a positive DC signal to heat the nonvolatile memory device to at least the critical ion mobility level. For example, the high resistance state is achievable by applying a DC signal to heat and cause ion movement, without a need for an AC signal.

Examples provided herein may be implemented in hardware and/or software. Example systems can include a processor and memory resources for executing instructions stored in a tangible non-transitory medium (e.g., volatile memory, non-volatile memory, and/or computer readable media), that are executable by a processor to implement examples according to the present disclosure.

An example system (e.g., a computing device) can include and/or receive a tangible non-transitory computer-readable medium storing a set of computer-readable instructions (e.g., software). As used herein, the processor can include one or a plurality of processors such as in a parallel processing system. The memory can include memory addressable by the processor for execution of computer readable instructions. The computer readable medium can include volatile and/or non-volatile memory such as a random access memory ("RAM"), magnetic memory such as a hard disk, floppy disk, and/or tape memory, a solid state drive ("SSD"), flash memory, phase change memory, and so on.

What is claimed is:

1. A system comprising:
   a nonvolatile memory device writable to a high resistance state and a low resistance state; and
   a controller to heat the nonvolatile memory device to at least a threshold temperature, based on application of an alternating current (AC) signal including a positive phase and a negative phase, and write to the nonvolatile memory device based on application of a direct current (DC) voltage bias.

2. The system of claim 1, wherein the nonvolatile memory device is a memristor, and the threshold temperature is associated with a critical ion mobility level.

3. The system of claim 1, wherein the voltage bias is a direct current (DC) voltage to induce ion movement.

4. The system of claim 1, wherein the voltage bias is to induce ion movement and not increase a temperature of the nonvolatile memory device during the application of the voltage bias.

5. The system of claim 1, wherein the voltage bias is positive to induce ion movement toward achieving the high resistance state.

6. The system of claim 1, wherein the voltage bias is negative to induce ion movement toward achieving the low resistance state.

7. The system of claim 1, wherein the AC signal is asymmetrically biased to affect a rate of ion movement during heating by the AC signal, to favor or oppose ion diffusion to a desired state based on application of the biased AC signal.

8. The system of claim 1, wherein the controller is to heat the nonvolatile memory device based on the AC signal according to a thermal gradient that is to overshoot the threshold temperature, to enable application of the voltage bias before the thermal gradient passes below the threshold temperature.

9. The system of claim 8, wherein application of the voltage bias is associated with not increasing the thermal gradient.

10. A system comprising:
a memory based on a plurality of memristors, wherein a memristor is writable to a high resistance state and a low resistance state;
a controller to select the memristor to be written, heat the memristor at or above a threshold temperature based on application of an alternating current (AC) signal including a positive phase and a negative phase, and write to the memristor based on application of a direct current (DC) voltage bias while the memristor is heated at or above the threshold temperature.

11. The system of claim 10, wherein the threshold temperature corresponds to a critical ion mobility level associated with ion mobility, and the voltage bias is to induce ion drift during ion mobility, separately from heating the memristor based on the AC signal.

12. A method, comprising:
applying an AC signal including a positive phase and a negative phase to a nonvolatile memory device to heat the nonvolatile memory device to at least a critical ion mobility level; and
writing the nonvolatile memory device to a low resistance state based on inducing ion movement by applying a negative DC signal to the nonvolatile memory device while at or above the critical ion mobility level as a result of heating by the AC signal.

13. The method of claim 12, further comprising writing the nonvolatile memory device to a high resistance state based on applying a positive DC signal to heat the nonvolatile memory device to at least the critical ion mobility level.

14. The method of claim 12, further comprising writing the nonvolatile memory device to a high resistance state based on applying the AC signal to heat the nonvolatile memory device to at least the critical ion mobility level, and applying a positive DC signal to induce ion movement while at or above the critical ion mobility level as a result of heating by the AC signal.

15. The method of claim 12, further comprising applying the AC signal based on an AC signal frequency corresponding to an amount of ion movement, during a phase of the AC signal, being approximately equal to or less than one-tenth a scale of the nonvolatile memory device.

* * * * *